United States Patent
Ito et al.

(10) Patent No.: US 9,105,810 B2
(45) Date of Patent: Aug. 11, 2015

(54) SEMICONDUCTOR LIGHT EMITTING DEVICE

(75) Inventors: Toshihide Ito, Tokyo (JP); Hiroshi Katsuno, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/404,607

(22) Filed: Feb. 24, 2012

(65) Prior Publication Data

US 2013/0087806 A1 Apr. 11, 2013

(30) Foreign Application Priority Data

Oct. 11, 2011 (JP) ................................. 2011-224369

(51) Int. Cl.
*H01L 33/00* (2010.01)
*H01L 33/32* (2010.01)
*H01L 33/40* (2010.01)

(52) U.S. Cl.
CPC .............. *H01L 33/32* (2013.01); *H01L 33/405* (2013.01); *H01L 2933/0016* (2013.01)

(58) Field of Classification Search
CPC ................................. H01L 33/32; H01L 33/08
USPC ............................................. 257/76, 103, 98
See application file for complete search history.

(56) References Cited

U.S. PATENT DOCUMENTS

| | | |
|---|---|---|
| 2005/0199895 A1 | 9/2005 | Seong et al. |
| 2007/0023777 A1 | 2/2007 | Sonobe et al. |
| 2008/0073659 A1 * | 3/2008 | Tamura et al. .................. 257/97 |
| 2010/0207123 A1 * | 8/2010 | Song ............................... 257/76 |
| 2011/0049537 A1 * | 3/2011 | Lee et al. ......................... 257/88 |

FOREIGN PATENT DOCUMENTS

| | | |
|---|---|---|
| JP | 59-205723 | 11/1984 |
| JP | 3-161932 | 7/1991 |
| JP | 2000-31123 | 1/2000 |
| JP | 2003-168823 A | 6/2003 |
| JP | 2005-260245 | 9/2005 |

(Continued)

OTHER PUBLICATIONS

Office Action issued Jun. 20, 2014 in Japanese Patent Application No. 2011-224369 (with English language translation).

(Continued)

*Primary Examiner* — Howard Weiss
*Assistant Examiner* — Tifney Skyles
(74) *Attorney, Agent, or Firm* — Oblon, McClelland, Maier & Neustadt, L.L.P.

(57) ABSTRACT

According to one embodiment, a semiconductor light emitting device includes a first semiconductor layer, a light emitting unit, a second semiconductor layer, a reflecting electrode, an oxide layer and a nitrogen-containing layer. The first semiconductor layer is of a first conductivity type. The light emitting unit is provided on the first semiconductor layer. The second semiconductor layer is provided on the light emitting unit and is of a second conductivity type. The reflecting electrode is provided on the second semiconductor layer and includes Ag. The oxide layer is provided on the reflecting electrode. The oxide layer is insulative and has a first opening. The nitrogen-containing layer is provided on the oxide layer. The nitrogen-containing layer is insulative and has a second opening communicating with the first opening.

27 Claims, 5 Drawing Sheets

(56) References Cited

FOREIGN PATENT DOCUMENTS

| JP | 2006-41403 A | 2/2006 |
| JP | 2006-245232 A | 9/2006 |
| JP | 2007-189097 A | 7/2007 |
| JP | 2008-507842 A | 3/2008 |
| JP | 2008-103499 | 5/2008 |
| JP | 2009-521814 A | 6/2009 |
| JP | 2010-263016 | 11/2010 |

OTHER PUBLICATIONS

Office Action issued May 7, 2015, in Japanese Patent Application No. 2014-163680, with English-language Translation.

* cited by examiner

SEMICONDUCTOR LIGHT EMITTING DEVICE

CROSS-REFERENCE TO RELATED APPLICATIONS

This application is based upon and claims the benefit of priority from the prior Japanese Patent Application No. 2011-224369, filed on Oct. 11, 2011; the entire contents of which are incorporated herein by reference.

FIELD

Embodiments described herein relate generally to a semiconductor light emitting device and a method for manufacturing the semiconductor light emitting device.

BACKGROUND

In a semiconductor light emitting device such as an LED (Light Emitting Diode) and the like, a configuration is used in which silver (Ag) having high reflectance is used as an electrode to increase the light extraction efficiency. However, in the case where Ag is used, migration occurs easily; stable characteristics are difficult to obtain; and the reliability is low.

DETAILED DESCRIPTION

Figure 1:
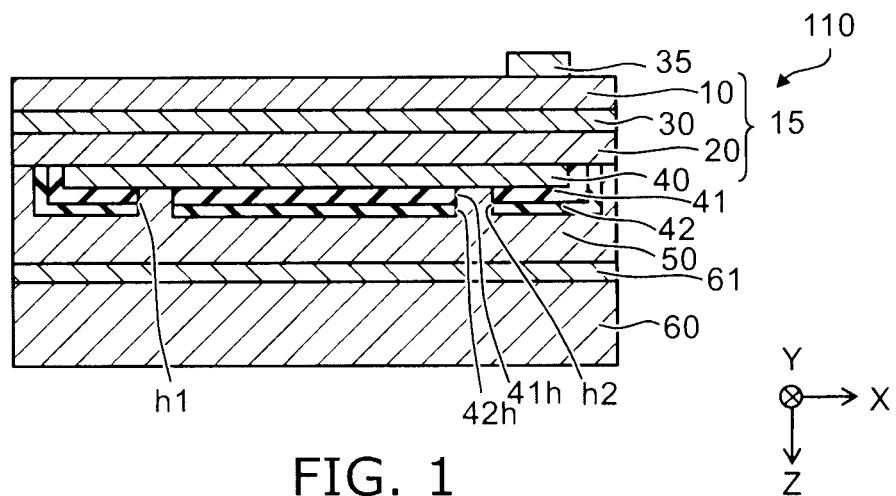
FIG. 1 is a schematic cross-sectional view illustrating the configuration of a semiconductor light emitting device according to a first embodiment.

According to one embodiment, a semiconductor light emitting device includes a first semiconductor layer, a light emitting unit, a second semiconductor layer, a reflecting electrode, an oxide layer and a nitrogen-containing layer. The first semiconductor layer is of a first conductivity type. The light emitting unit is provided on the first semiconductor layer. The second semiconductor layer is provided on the light emitting unit and is of a second conductivity type. The reflecting electrode is provided on the second semiconductor layer and includes Ag. The oxide layer is provided on the reflecting electrode. The oxide layer is insulative and has a first opening. The nitrogen-containing layer is provided on the oxide layer. The nitrogen-containing layer is insulative and has a second opening communicating with the first opening.

According to another embodiment, a semiconductor light emitting device includes a first semiconductor layer, a light emitting unit, a second semiconductor layer, a reflecting electrode, an oxide layer, and a nitrogen-containing layer. The first semiconductor layer is of a first conductivity type. The light emitting unit is provided on the first semiconductor layer. The second semiconductor layer is provided on the light emitting unit and is of a second conductivity type. The reflecting electrode is provided on the second semiconductor layer, and the reflecting electrode includes Ag. The oxide layer is provided on the reflecting electrode. The oxide layer is conductive. The nitrogen-containing layer is provided on the oxide layer. The nitrogen-containing layer is conductive.

According to another embodiment, a method is disclosed for manufacturing a semiconductor light emitting device. The method can include forming a reflecting electrode including Ag on a second semiconductor layer of a stacked body. The stacked body includes a first semiconductor layer of a first conductivity type, a light emitting unit provided on the first semiconductor layer, and the second semiconductor layer of a second conductivity type provided on the light emitting unit. The method can include forming an oxide layer on the reflecting electrode. The method can include performing heat treatment of a processing body including the stacked body, the reflecting electrode, and the oxide layer in an atmosphere including oxygen. In addition, the method can include forming a nitrogen-containing layer on the heat-treated oxide layer.

Various embodiments will be described hereinafter with reference to the accompanying drawings.

The drawings are schematic or conceptual; and the relationships between the thicknesses and the widths of portions, the proportions of sizes among portions, and the like are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 2:
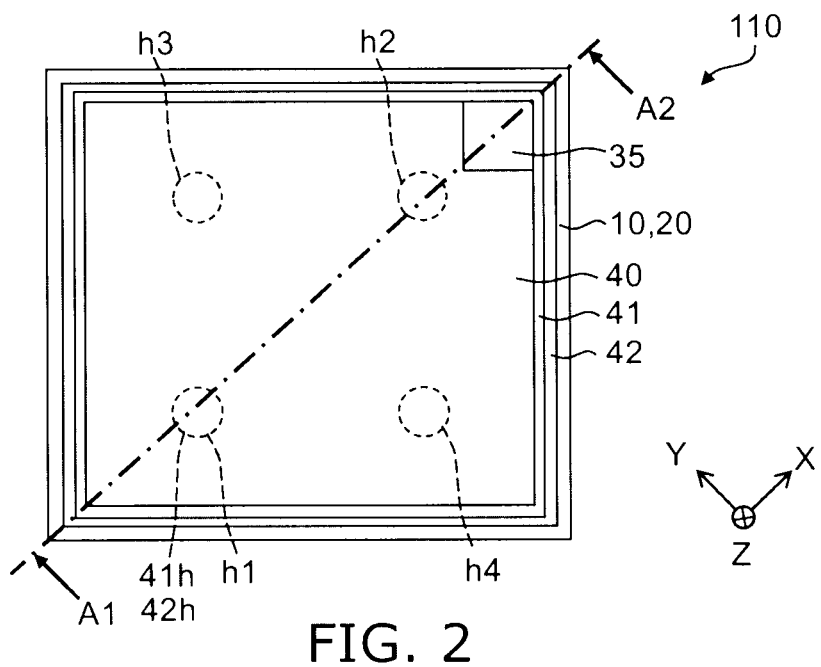
FIG. 2 is a schematic see-through plan view illustrating the configuration of the semiconductor light emitting device according to the first embodiment.

FIG. 1 is a schematic cross-sectional view illustrating the configuration of a semiconductor light emitting device according to a first embodiment. FIG. 2 is a schematic see-through plan view illustrating the configuration of the semiconductor light emitting device according to the first embodiment.

FIG. 1 is a cross-sectional view along line A1-A2 of FIG. 2.

As illustrated in FIG. 1 and FIG. 2, the semiconductor light emitting device 110 according to the embodiment includes a first semiconductor layer 10, a light emitting unit 30, a second semiconductor layer 20, a reflecting electrode 40, an oxide layer 41, and a nitrogen-containing layer 42.

The first semiconductor layer 10 has a first conductivity type. The light emitting unit 30 is provided on the first semiconductor layer 10. The second semiconductor layer 20 is provided on the light emitting unit 30. The second semiconductor layer 20 has a second conductivity type different from the first conductivity type. For example, the first conductivity type is an n-type; and the second conductivity type is a p-type. However, the embodiment is not limited thereto. The first conductivity type may be the p-type; and the second conductivity type may be the n-type. Hereinbelow, the case is described where the first conductivity type is the n-type and the second conductivity type is the p-type.

Herein, a direction from the first semiconductor layer 10 toward the second semiconductor layer 20 is taken as a Z-axis direction. One direction perpendicular to the Z-axis direction is taken as an X-axis direction. A direction perpendicular to the Z-axis direction and the X-axis direction is taken as a Y-axis direction. The Z-axis direction is the stacking direction of the first semiconductor layer 10, the light emitting unit 30, and the second semiconductor layer 20. The first semiconductor layer 10, the light emitting unit 30, and the second semiconductor layer 20 are included in a stacked body 15.

The reflecting electrode 40 is provided on the second semiconductor layer 20. The reflecting electrode 40 includes silver (Ag).

The oxide layer 41 is provided on the reflecting electrode 40. In this example, the oxide layer 41 is insulative and has a first opening 41h. As described below, the oxide layer 41 may be conductive. The first opening 41h may not be provided in the case where the oxide layer 41 is conductive.

The nitrogen-containing layer 42 is provided on the oxide layer 41. In this example, the nitrogen-containing layer 42 is insulative and has a second opening 42h. At least a portion of the second opening 42h communicates with the first opening 41h. As described below, the nitrogen-containing layer 42 may be conductive. The second opening 42h may not be provided in the case where the nitrogen-containing layer 42 is conductive.

For example, the surface area of the portion of the reflecting electrode 40 exposed at the first opening 41h of the oxide layer 41 and the second opening 42h of the nitrogen-containing layer 42 is less than the surface area of the portion of the reflecting electrode 40 covered with the oxide layer 41 in the case where the oxide layer 41 has the first opening 41h and the nitrogen-containing layer 42 has the second opening 42h.

In the case where the oxide layer 41 is insulative, the oxide layer 41 may include an oxide of at least one selected from Si, Ge, Ti, Zr, Hf, Ce, Y, and La. For example, $SiO_2$ may be used as the oxide layer 41.

In the case where the nitrogen-containing layer 42 is insulative, the nitrogen-containing layer 42 may include a nitride or an oxynitride of at least one selected from Si, Ge, Ti, Zr, Hf, and Ce. For example, $Si_3N_4$ may be used as the nitrogen-containing layer 42. SiON may be used as the nitrogen-containing layer 42.

In this example as illustrated in FIG. 1, the semiconductor light emitting device 110 further includes a first semiconductor-layer side electrode 35. The second semiconductor layer 20 is disposed between the first semiconductor-layer side electrode 35 and the reflecting electrode 40. The light emitting unit 30 is disposed between the second semiconductor layer 20 and the first semiconductor-layer side electrode 35. The first semiconductor layer 10 is disposed between the light emitting unit 30 and the first semiconductor-layer side electrode 35.

A metal layer 50 also is provided. At least a portion of the metal layer 50 is provided inside the first opening 41h and the second opening 42h. For example, the metal layer 50 covers at least a portion of the nitrogen-containing layer 42. The metal layer 50 is electrically connected to the reflecting electrode 40 via the first opening 41h and the second opening 42h.

The metal layer 50 may include, for example, a stacked film that includes a Ti film contacting the reflecting electrode 40, a Pt film provided on the Ti film, and a Au film provided on the Pt film. At least a portion of the metal layer 50 is provided inside the first opening 41h and the second opening 42h. The metal layer 50 is electrically connected to the reflecting electrode 40 via the first opening 41h and the second opening 42h.

In this example, a support substrate 60 and a bonding layer 61 are provided. The metal layer 50 is disposed between the support substrate 60 and the reflecting electrode 40. The bonding layer 61 is disposed between the support substrate 60 and the metal layer 50. The support substrate 60 may include, for example, a silicon substrate. The bonding layer 61 may include, for example, a Au—Sn alloy.

For example, crystal growth of the first semiconductor layer 10, the light emitting unit 30, and the second semiconductor layer 20 is performed sequentially on a not-illustrated crystal growth substrate. The reflecting electrode 40, the oxide layer 41, and the nitrogen-containing layer 42 are formed on the second semiconductor layer 20. The metal layer 50 is formed on the nitrogen-containing layer 42. Subsequently, the crystal growth substrate is removed; and the first semiconductor-layer side electrode 35 is formed on the exposed first semiconductor layer 10. The metal layer 50 and the bonding layer 61 are bonded. Thereby, the semiconductor light emitting device 110 is obtained.

As illustrated in FIG. 2, multiple first openings 41h and multiple second openings 42h may be provided. In this example, four of these openings are provided. The second opening 42h communicates with the reflecting electrode 40 via the first opening 41h at each of openings h1, h2, h3, and h4.

Light is emitted from the light emitting unit 30 by applying a voltage to the metal layer 50 and the first semiconductor-layer side electrode 35. The light emitted from the light emitting unit 30 is reflected by the reflecting electrode 40 and is emitted to the outside mainly from the surface on the first semiconductor layer 10 side.

The first semiconductor layer 10 may include, for example, an n-type GaN layer. The second semiconductor layer 20 may include, for example, a p-type GaN layer.

Figure 3:
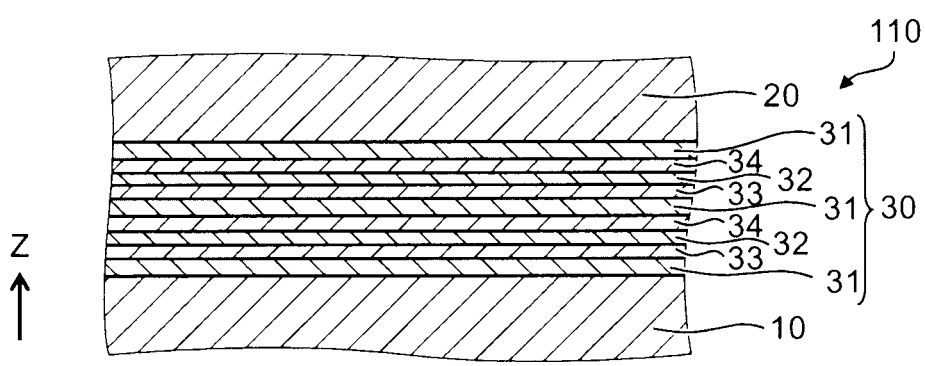
FIG. 3 is a schematic cross-sectional view illustrating the configuration of a portion of the semiconductor light emitting device according to the first embodiment.

FIG. 3 is a schematic cross-sectional view illustrating the configuration of a portion of the semiconductor light emitting device according to the first embodiment.

In the semiconductor light emitting device 110 according to the embodiment as illustrated in FIG. 3, the light emitting unit 30 includes multiple barrier layers 31 and a well layer 32 provided between the multiple barrier layers 31. Although two well layers 32 are illustrated in this example, the number of the well layers 32 may be one, three, or more. In other words, the light emitting unit 30 may have a SQW (Single-Quantum Well) structure or a MQW (Multi-Quantum Well) structure.

In this example, an intermediate layer is provided between the barrier layer 31 and the well layer 32. For example, a first intermediate layer 33 is provided between the well layer 32 and the barrier layer 31 on the first semiconductor layer 10 side as viewed from the well layer 32. A second intermediate layer 34 is provided between the well layer 32 and the barrier layer 31 on the second semiconductor layer 20 side as viewed from the well layer 32.

The barrier layer 31 may include, for example, $In_{xb}Al_{yb}Ga_{1-xb-yb}N$ (0<xb<1 and 0<yb<1). The barrier layer 31 may include, for example, $In_{0.02}Al_{0.33}Ga_{0.65}N$. The thickness of the barrier layer 31 is, for example, 12.5 nanometers (nm).

The first intermediate layer 33 may include, for example, $In_{x1}Ga_{1-x1}N$ (0<x1<1). The first intermediate layer 33 may include, for example, $In_{0.02}Ga_{0.98}N$. The thickness of the first intermediate layer 33 is, for example, 0.5 nm.

The well layer 32 may include, for example, $In_{x0}Ga_{1-x0}N$ (0<x0<1). The well layer 32 may include, for example, $In_{0.15}Ga_{0.85}N$. The thickness of the well layer 32 is, for example, 2.5 nm.

The second intermediate layer 34 may include, for example, $In_{x2}Ga_{1-x2}N$ (0<x2<1). The second intermediate layer 34 may include, for example, $In_{0.02}Ga_{0.98}N$. The thickness of the second intermediate layer 34 is, for example, 0.5 nm.

The first intermediate layer 33 and the second intermediate layer 34 may be provided if necessary and may be omitted. In the case where multiple barrier layers 31 are provided, at least one selected from the composition and the thickness may be different between the multiple barrier layers 31. In the case where multiple well layers 32 are provided, at least one selected from the composition and the thickness may be different between the multiple well layers 32.

As recited above, the first semiconductor layer 10, the light emitting unit 30, and the second semiconductor layer 20 include a nitride semiconductor. The peak wavelength of the light emitted from the light emitting unit 30 is not less than 410 nm and not more than 700 nm. In particular, a high light extraction efficiency is obtained by using Ag as the reflecting electrode for a semiconductor light emitting device that emits light of ultraviolet to blue.

An example of a method for manufacturing the semiconductor light emitting device 110 will now be described.

Figure 4:
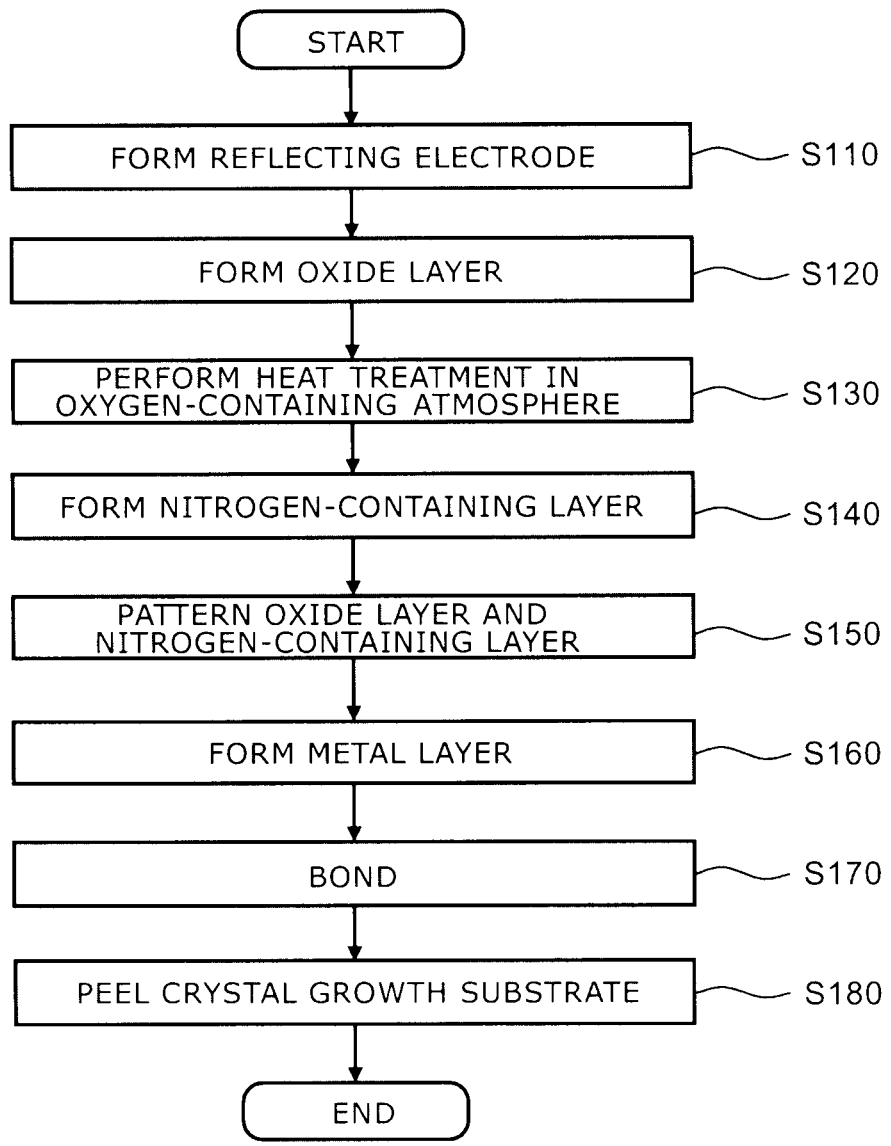
FIG. 4 is a flowchart illustrating a method for manufacturing the semiconductor light emitting device according to the first embodiment.

FIG. 4 is a flowchart illustrating the method for manufacturing the semiconductor light emitting device according to the first embodiment.

FIG. 5A to FIG. 5E are schematic cross-sectional views in order of the processes, illustrating the method for manufacturing the semiconductor light emitting device according to the first embodiment.

As illustrated in FIG. 4, the reflecting electrode 40 including Ag is formed on the second semiconductor layer 20 of the stacked body 15 that includes the first semiconductor layer 10, the light emitting unit 30, and the second semiconductor layer 20 (step S110).

Figure 5A:
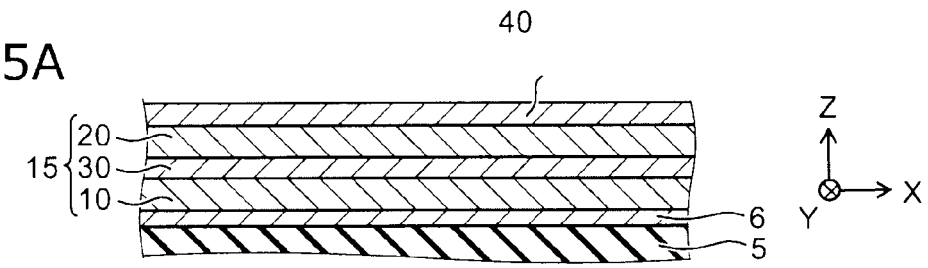
FIG. 5A to FIG. 5E are schematic cross-sectional views in order of the processes, illustrating the method for manufacturing the semiconductor light emitting device according to the first embodiment.

For example, as illustrated in FIG. 5A, the nitride semiconductor layers used to form the stacked body 15 are sequentially deposited on a crystal growth substrate 5 of sapphire using, for example, metal organic chemical vapor deposition (MOCVD). For example, a buffer layer 6 is formed on the sapphire crystal growth substrate 5; and an n-type GaN layer used to form the first semiconductor layer 10 is formed on the buffer layer 6. The light emitting unit 30 is formed on the n-type GaN layer. A p-type GaN layer used to form the second semiconductor layer 20 is formed on the light emitting unit 30. Then, a Ag layer used to form the reflecting electrode 40 is formed on the p-type GaN layer.

Figure 5B:
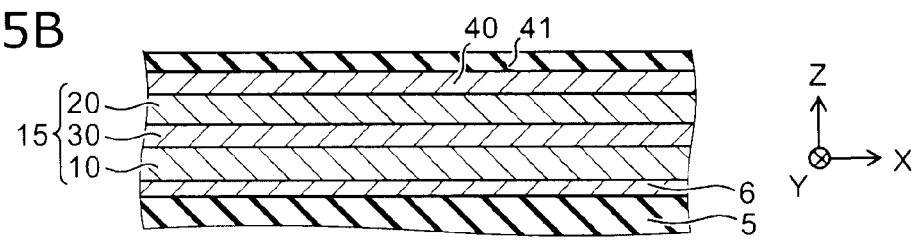

In this manufacturing method as illustrated in FIG. 4 and FIG. 5B, the oxide layer 41 is formed on the reflecting electrode 40 (step S120). For example, a $SiO_2$ film used to form the oxide layer 41 is formed, for example, on the reflecting electrode 40. The formation of the $SiO_2$ film may include, for example, vacuum vapor deposition, sputtering, and the like.

Figure 5C:
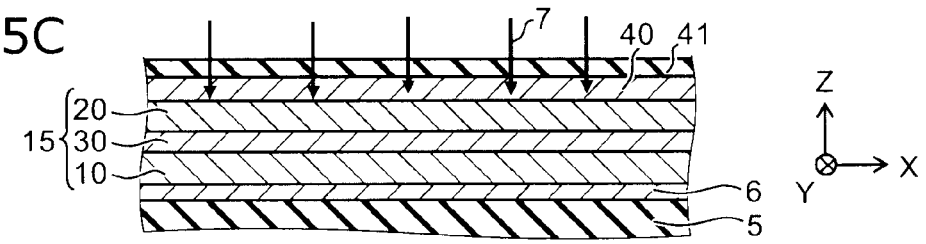

As illustrated in FIG. 4 and FIG. 5C, heat treatment of a processing body including the stacked body 15, the reflecting electrode 40, and the oxide layer 41 is performed in an atmosphere including oxygen (step S130). For example, annealing is performed in an oxygen atmosphere at a temperature not less than 200° C. and not more than 500° C. For example, sintering is performed in an oxygen atmosphere. At this time, as illustrated in FIG. 5C, oxygen 7 reaches the reflecting electrode 40 via the oxide layer 41. An ohmic contact is formed between the reflecting electrode 40 and the second semiconductor layer 20 (the p-type GaN layer).

Figure 5D:
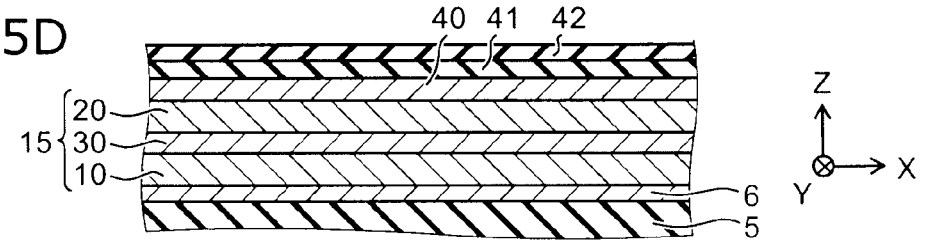

Then, as illustrated in FIG. 4 and FIG. 5D, the nitrogen-containing layer 42 is formed on the heat-treated oxide layer 41 (step S140). For example, a $Si_3N_4$ film is formed as the nitrogen-containing layer 42. The nitrogen-containing layer 42 is formed to cover the oxide layer 41. In the embodiment, the nitrogen-containing layer 42 may be formed by nitriding the surface portion of the layer used to form the oxide layer 41.

In the case where the oxide layer 41 and the nitrogen-containing layer 42 are insulative, the first opening 41h and the second opening 42h are made.

Figure 5E:
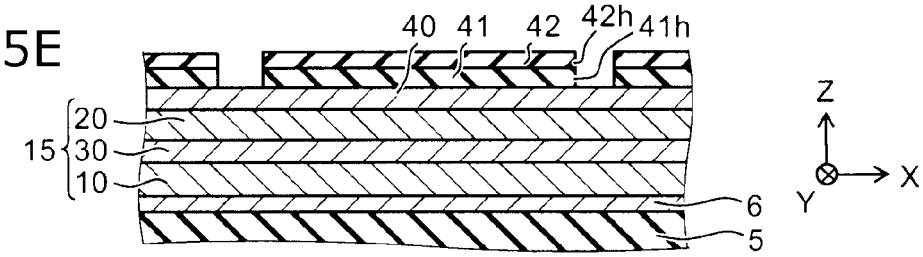

In other words, as illustrated in FIG. 4 and FIG. 5E, the oxide layer 41 and the nitrogen-containing layer 42 are patterned (step S150). This patterning may include, for example, photolithography and etching.

Then, as illustrated in FIG. 4, the metal layer 50 is formed to electrically contact the reflecting electrode 40 at the portions from which the oxide layer 41 and the nitrogen-containing layer 42 are removed (the first opening 41h and the second opening 42h) by the patterning of the oxide layer 41 and the nitrogen-containing layer 42 (step S160). For example, a stacked film of a Ti film/Pt film/Au film, which is used to form the metal layer 50, is formed.

For example, a Si substrate that is used to form the support substrate 60 is prepared. A Au—Sn layer used to form the bonding layer 61 is formed on the major surface of the support substrate 60. The metal layer 50 of the processing body recited above is caused to oppose the bonding layer 61. For example, the metal layer 50 and the bonding layer 61 are bonded by applying pressure to these substrates at a high temperature not less than 250° C. (step S170).

Then, the crystal growth substrate 5 is peeled from the stacked body 15 using pulse irradiation of a UV (Ultra-Violet) laser (e.g., a KrF laser having a wavelength of 248 nm) from the crystal growth substrate 5 side (step S180).

The stacked body 15 is separated into devices by patterning the stacked body 15 using lithography and etching. At this time, the metal layer 50 is not patterned and is exposed between the stacked bodies 15 that are separated into the devices. The patterned stacked bodies 15 have mesa configurations in which the side surfaces are tilted in tapered configurations. In other words, the width of the first semiconductor layer 10 in a direction perpendicular to the Z-axis direction is narrower than the width of the second semiconductor layer 20 in the direction perpendicular to the Z-axis direction. For example, the surface area of the film surface increases continuously from the first semiconductor layer 10 toward the second semiconductor layer 20.

Then, a protective layer (not illustrated in FIG. 1) is formed to cover the surfaces of the stacked bodies 15 and the metal layer 50. For example, a $SiO_2$ film is formed as the protective layer. Then, the protective layer covering the upper surfaces of the stacked bodies 15 is removed. At this time, the protective layer remains on the outer edge portions of the upper surfaces of the stacked bodies 15 (the surfaces on the first semiconductor layer 10 side). Thereby, the upper surfaces of the stacked bodies 15 are exposed except at the outer edge portions.

Wet etching of the upper surfaces of the stacked bodies 15 is performed. For example, etching is performed using potassium hydroxide with a concentration of 1 mol/l and a temperature of 70° C. for 15 minutes. The upper surfaces of the stacked bodies 15 are surface-roughened. Then, the first semiconductor-layer side electrode 35 is formed on the upper surfaces of the stacked bodies 15. It is favorable for the first semiconductor-layer side electrode 35 to include a material having high alkali tolerance. It is favorable for the first semiconductor-layer side electrode 35 to include, for example, a material including a metal selected from Pt, Au, Ni, and Ti.

Using the methods recited above, the semiconductor light emitting device 110 can be formed. The semiconductor light emitting device 110 is a thin film (TF) semiconductor light emitting device from which the crystal growth substrate 5 is removed.

In the semiconductor light emitting device 110 according to the embodiment, Ag, which has a high reflectance, is used as the electrode provided on the second semiconductor layer 20. Contact between the Ag electrode and the p-type GaN layer cannot be obtained only by forming the Ag electrode on the p-type GaN layer. According to investigations of the inventor of the application, the contact resistance between the Ag electrode and the p-type GaN layer is reduced by performing heat treatment after forming the Ag electrode on the p-type GaN layer. In such a case, the atmosphere of the heat treatment affects the contact resistance.

Figure 6:
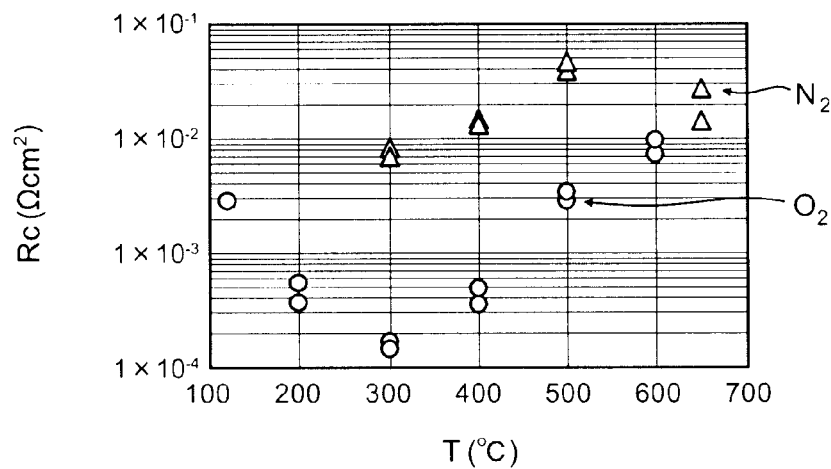
FIG. 6 is a graph illustrating characteristics of the semiconductor light emitting device.

FIG. 6 is a graph illustrating characteristics of the semiconductor light emitting device.

FIG. 6 illustrates the measurement results of the contact resistance between the p-type GaN layer and the Ag layer when the reflecting electrode 40 (the Ag layer) is formed on the second semiconductor layer 20 (the p-type GaN layer) and heat treatment is performed subsequently in nitrogen and in oxygen. The horizontal axis of FIG. 6 is a temperature T (° C.) of the heat treatment; and the vertical axis of FIG. 6 is a contact resistance Rc ($\Omega cm^2$). In FIG. 6, the triangular symbols correspond to the heat treatment in nitrogen; and the round symbols correspond to the heat treatment in oxygen.

It can be seen from FIG. 6 that the contact resistance Rc is high for the heat treatment in nitrogen (the triangular symbols). Conversely, the contact resistance is low for the heat treatment in oxygen (the round symbols). Thus, heat treatment in an atmosphere including oxygen is effective to obtain a low contact resistance Rc.

However, in the case where heat treatment in oxygen is performed on the Ag layer formed on the p-type GaN layer, migration of the Ag occurs; and stable characteristics cannot be obtained.

It is conceivable to form another metal layer on the Ag layer to suppress the migration. However, for example, in a configuration in which a Pt layer, a Rh layer, a Ni layer, or an Al layer is formed on the Ag layer, it was learned that the operating voltage Vf of the semiconductor light emitting device increases; and the light output decreases easily.

By analyses of the inventor of the application, it was learned that, for example, the light emission intensity is lower at the central portion of the reflecting electrode 40 than at the peripheral portion for a configuration in which a Ni layer is formed on the Ag layer of the reflecting electrode 40. It is conceivable that this is because Ni does not transmit oxygen. In other words, it is conceivable that at the peripheral portion, the contact resistance Rc between the p-type GaN layer and the Ag layer decreases because oxygen is supplied to the Ag layer via the end surface of the Ag layer; while at the central portion, the contact resistance Rc does not decrease sufficiently because oxygen is not supplied to the Ag layer. In other words, ohmic contact is obtained only at the circumferential edge portion of the reflecting electrode 40; and ohmic contact is not obtained at the central portion of the reflecting electrode 40. Therefore, the operating voltage Vf increases because a uniform current cannot be injected. Then, the obtained light output also decreases. In other words, the luminous efficiency is low. Also, by analyzing a sample in which a Ni layer was formed on the Ag layer, a phenomenon was observed in which the Ni element diffused into the interface between the Ag layer and the p-type GaN layer.

Thus, the operating voltage Vf increases and the light output easily decreases in a configuration in which another metal layer is formed on the Ag layer to suppress the migration.

In the embodiment, the heat treatment is performed in the state in which the oxide layer 41 is formed on the reflecting electrode 40 (the Ag layer). In such a case, a low contact resistance is obtained by performing the heat treatment in the oxygen atmosphere. Then, the oxygen can be supplied uniformly to the Ag layer because the oxide layer 41 transmits the oxygen. Thereby, a uniform and low contact resistance Rc is obtained inside the surface of the reflecting electrode 40. Thereby, the increase of the operating voltage Vf and the decrease of the light output can be suppressed. Further, the migration of the Ag is suppressed during and after the heat treatment because the reflecting electrode 40 is substantially covered with the oxide layer 41.

The reliability decreases easily in a configuration in which only the oxide layer 41 is provided on the reflecting electrode 40 of Ag. In other words, the oxide layer 41 easily transmits impurities such as moisture and the like. For example, the migration of the Ag occurs easily in the case where water reaches the Ag layer via the oxide layer 41. For example, sulfides of the Ag occur and the desired characteristics are not obtained in the case where sulfur (S) reaches the Ag layer via the oxide layer 41. Other elements included in the metal layer 50 and the bonding layer 61 easily diffuse via the oxide layer 41 to the interface between the Ag layer and the p-type GaN layer.

In the embodiment, a two-layer configuration including the oxide layer 41 provided on the reflecting electrode 40 of Ag and the nitrogen-containing layer 42 provided on the oxide layer 41 is employed. By providing the nitrogen-containing layer 42 on the oxide layer 41, the migration due to the penetration of water, the occurrence of sulfides, and the diffusion of other elements to the interface between the Ag layer and the p-type GaN layer can be suppressed.

Thus, in the embodiment, a low and uniform contact resistance is obtained by performing the heat treatment via the oxide layer 41 in the oxygen atmosphere. Simultaneously, various degradation caused by impurities and the like from the outside can be suppressed by the nitrogen-containing layer 42. In the embodiment, a configuration is employed in which the oxide layer 41 can be formed on the Ag layer instead of forming a metal which diffuses easily; and the heat treatment can be performed via the oxide layer 41. Thereby, a uniform light emission distribution can be obtained at a low operating voltage. High reliability is realized by further providing the nitrogen-containing layer 42.

For example, the thickness of the oxide layer 41 is not less than 1 nanometers (nm) and not more than 100 nm. The suppression effect of the migration of the Ag decreases in the case where the thickness of the oxide layer 41 is thinner than 1 nm. There are cases where the transmissivity of the oxygen decreases and the contact resistance Rc does not decrease sufficiently when the thickness of the oxide layer 41 is thicker than 100 nm.

For example, the thickness of the nitrogen-containing layer 42 is not less than 1 nm and not more than 10 nm. The blocking effect with respect to the impurities such as the water, etc., decreases in the case where the thickness of the nitrogen-containing layer 42 is thinner than 1 nm. The patterning to make the openings becomes difficult in the case where the thickness of the nitrogen-containing layer 42 is thicker than 10 nm.

For example, in a configuration in which a nitrogen-containing layer (a $Si_3N_4$ film and the like) is directly formed on the Ag layer without forming the oxide layer 41, it is difficult to obtain a low contact resistance because sufficient oxygen is not supplied to the Ag layer. Similarly, even in a configuration in which the nitrogen-containing layer 42 is formed on the Ag layer and the oxide layer 41 is formed on the nitrogen-containing layer 42, it is difficult to obtain a low contact resistance because sufficient oxygen is not supplied to the Ag layer.

In other words, it is difficult to obtain a semiconductor light emitting device including an electrode formed using silver that has high performance and high reliability in the cases of the configuration in which only the oxide layer 41 is formed on the Ag layer, the configuration in which only the nitrogen-containing layer 42 is formed on the Ag layer, and the configuration in which the nitrogen-containing layer 42 is formed on the Ag layer and the oxide layer 41 is formed on the nitrogen-containing layer 42 (where the stacking order is the reverse of that of the embodiment). Conversely, in the embodiment in which the oxide layer 41 is provided on the Ag layer and the nitrogen-containing layer 42 is provided on the oxide layer 41, a semiconductor light emitting device including an electrode formed using silver that has high performance and high reliability can be obtained.

The heat treatment is performed in the atmosphere including oxygen after forming the oxide layer 41 and prior to the forming of the nitrogen-containing layer 42 because the oxygen is blocked by the nitrogen-containing layer 42 in the case where the heat treatment is performed in oxygen in the state in which the nitrogen-containing layer 42 is formed on the oxide layer 41 which is formed on the Ag layer. In the embodiment, for example, much hydrogen is included in the nitrogen-containing layer 42 in the case where the nitrogen-containing layer 42 (e.g., the $Si_3N_4$) is formed using CVD (Chemical Vapor Deposition). Such hydrogen acts to inactivate the p-type GaN layer. For example, there is a possibility that the hydrogen inside the nitrogen-containing layer 42 may have a negative effect on the p-type GaN layer in the configuration in which the nitrogen-containing layer 42 is directly formed on the Ag layer. In such a case, in the embodiment, the negative effect of the hydrogen on the p-type GaN layer also may be suppressed by interposing the oxide layer 41 between the nitrogen-containing layer 42 and the Ag layer.

In the embodiment, the type of the metallic element included in the nitrogen-containing layer 42 may be the same as the type of the metallic element included in the oxide layer 41. For example, in the case where $SiO_2$ is used as the oxide layer 41, $Si_3N_4$ is used as the nitrogen-containing layer 42. Thereby, there are fewer interface defects at the interface between the oxide layer 41 and the nitrogen-containing layer 42. For example, the occurrence of local current leakage can be suppressed. Thereby, for example, a nonuniform light emission caused by local leakage can be suppressed; and the luminous efficiency can be increased.

In the case where the oxide layer 41 and the nitrogen-containing layer 42 are insulative, the first opening 41h is provided in the oxide layer 41 and the second opening 42h is provided in the nitrogen-containing layer 42 to obtain an electrical connection to the reflecting electrode 40.

In the case where the widths of the first opening 41h and the second opening 42h (the lengths along a direction perpendicular to the Z-axis direction) are excessively large, the degree of the suppression of the migration of the Ag of the reflecting electrode 40 decreases. By setting the surface area of the portion of the reflecting electrode 40 exposed at the first opening 41h and the second opening 42h to be less than the surface area of the portion of the reflecting electrode 40 covered with the oxide layer 41, the migration of the Ag can be effectively suppressed.

For example, there are cases where a protective layer such as a $SiO_2$ film and the like is formed on the side surfaces and the like of the stacked body 15; and a configuration is conceivable in which such a protective layer is provided also on a portion of the circumferential edge portion of the reflecting electrode 40 of the Ag. However, in such a configuration, it is difficult to suppress the migration of the Ag of the reflecting electrode 40 because the protective layer is provided only on a portion of the circumferential edge portion of the reflecting electrode 40.

In the embodiment, the migration of the Ag can be effectively suppressed by covering not less than half of the surface area of the reflecting electrode 40 of the Ag with the oxide layer 41.

On the other hand, the resistance of the electrical connection of the reflecting electrode 40 (e.g., the resistance between the reflecting electrode 40 and the metal layer 50) has a tendency to increase in the case where the widths of the first opening 41h and the second opening 42h are excessively small. However, in a practical configuration, the increase of the resistance is substantially not a problem. For example, the resistance between the reflecting electrode 40 and the metal layer 50 can be practically reduced enough by setting the widths of the first opening 41h and the second opening 42h to be not less than about 1 micrometers (μm).

Because the conductivity of Ag is sufficiently high, the current spreads sufficiently in the lateral direction (the direction perpendicular to the Z axis) inside the Ag layer. For example, in calculations regarding the case where the first opening 41h and the second opening 42h are provided with widths of 1 μm, the current spreads to a distance of 0.5 mm from the first opening 41h and the second opening 42h. Accordingly, a uniform light emission is obtained for substantially the entire surface of the semiconductor light emitting device by providing one first opening 41h and one second opening 42h in, for example, a semiconductor light emitting device having sides of about 0.5 mm.

In calculations regarding the case where the first opening 41h and the second opening 42h are provided with widths of about 1 μm when an insulative oxide layer 41 and an insulative nitrogen-containing layer 42 are provided, the increase of the operating voltage Vf is about 0.05 millivolts (mV); and the operating voltage Vf substantially does not increase.

In the example of the method for manufacturing the semiconductor light emitting device 110 described in regard to FIG. 4, heat treatment of the processing body including the stacked body 15, the reflecting electrode 40, and the oxide layer 41 may further be performed at reduced pressure or in a nitrogen atmosphere prior to the heat treatment in the atmosphere including oxygen (step S130). For example, the heat treatment in the oxygen atmosphere is performed after the heat treatment in the nitrogen atmosphere. By performing the heat treatment in the nitrogen atmosphere, for example, the adhesion strength of the reflecting electrode 40 to the stacked body 15 improves. Also, the adhesion strength of the oxide layer 41 to the reflecting electrode 40 improves. Thereby, higher reliability is obtained.

In the case where the oxide layer 41 includes an oxide of at least one selected from Si, Ge, Hf, and Zr in the method for manufacturing the semiconductor light emitting device according to the embodiment, the first opening 41h and the second opening 42h are made such that the surface area of the portion of the reflecting electrode 40 exposed at the first opening 41h and the second opening 42h is less than the surface area of the portion of the reflecting electrode 40 covered with the oxide layer 41.

Figure 7:
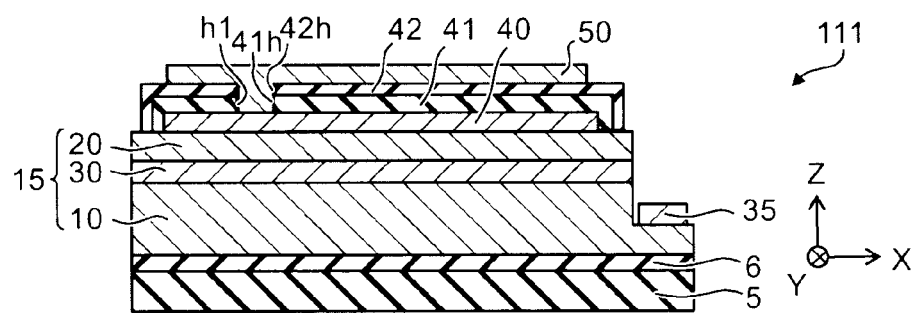
FIG. 7 is a schematic cross-sectional view illustrating the configuration of another semiconductor light emitting device according to the first embodiment.

FIG. 7 is a schematic cross-sectional view illustrating the configuration of another semiconductor light emitting device according to the first embodiment.

Figure 8:
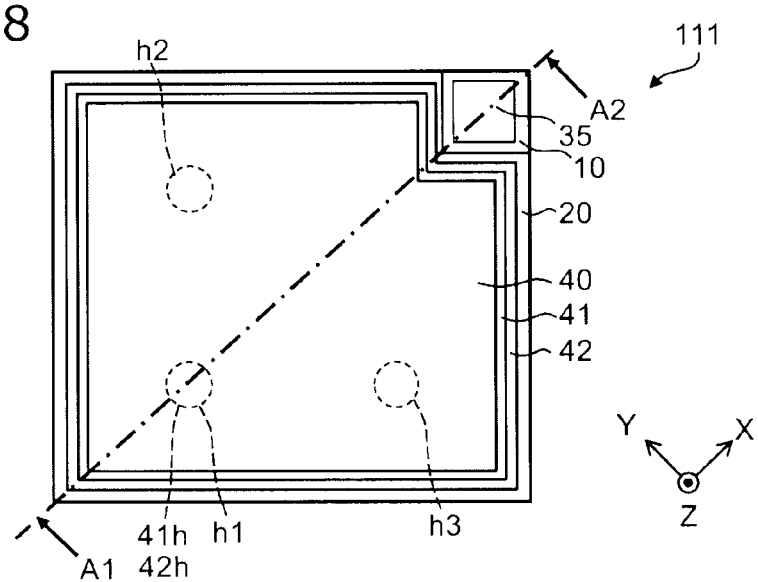
FIG. 8 is a schematic see-through plan view illustrating the configuration of this semiconductor light emitting device according to the first embodiment.

FIG. 8 is a schematic see-through plan view illustrating the configuration of this semiconductor light emitting device according to the first embodiment.

FIG. 7 is a cross-sectional view along line A1-A2 of FIG. 8.

As illustrated in FIG. 1 and FIG. 2, the semiconductor light emitting device 111 according to the embodiment also includes the first semiconductor layer 10, the light emitting unit 30, the second semiconductor layer 20, the reflecting electrode 40, the oxide layer 41, and the nitrogen-containing layer 42. The light emitting unit 30 is provided on a portion of the first semiconductor layer 10; and the second semiconductor layer 20 is provided on the light emitting unit 30. The semiconductor light emitting device 111 further includes the crystal growth substrate 5 and the buffer layer 6. The crystal growth substrate 5 may include, for example, various materials such as sapphire, GaN, SiC, Si, GaAs, and the like. The buffer layer 6 may include a nitride semiconductor. The buffer layer 6 is provided on the crystal growth substrate 5; and the first semiconductor layer 10, the light emitting unit 30, and the second semiconductor layer 20 are provided on the buffer layer 6.

In this case as well, the reflecting electrode 40 including Ag is provided on the second semiconductor layer 20. The oxide layer 41 that is insulative and has the first opening 41h is provided on the reflecting electrode 40. The nitrogen-containing layer 42 that is insulative and has the second opening 42h that communicates with the first opening 41h is provided on the oxide layer 41.

The metal layer 50 also is provided. At least a portion of the metal layer 50 is provided inside the first opening 41h and the second opening 42h. The metal layer 50 is electrically connected to the reflecting electrode 40 via the first opening 41h and the second opening 42h.

The first semiconductor-layer side electrode 35 is provided on a portion of the first semiconductor layer 10 that does not oppose the light emitting unit 30.

The semiconductor light emitting device 111 is a FC (Flip Chip) semiconductor light emitting device.

In the semiconductor light emitting device 111, for example, the surface area of the portion of the reflecting electrode 40 exposed at the first opening 41h and the second opening 42h is less than the surface area of the portion of the reflecting electrode 40 covered with the oxide layer 41.

In the semiconductor light emitting device 111 as well, an electrode formed using silver that has high performance and high reliability can be realized.

Second Embodiment

Figure 9:
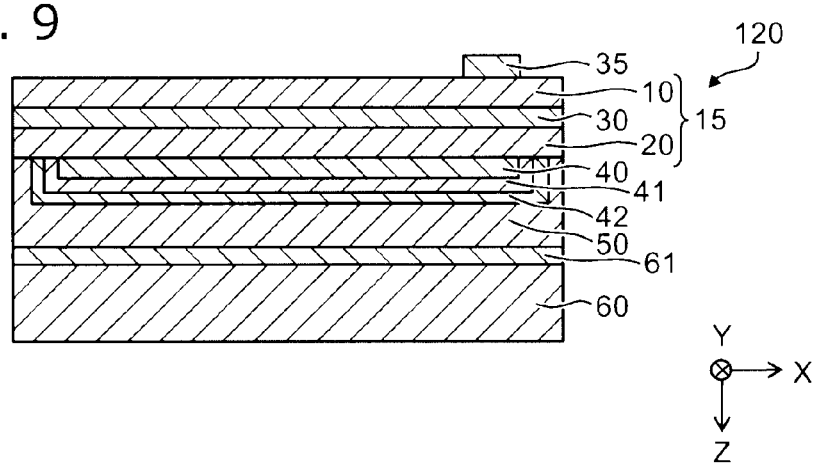
FIG. 9 is a schematic cross-sectional view illustrating the configuration of a semiconductor light emitting device according to a second embodiment.

FIG. 9 is a schematic cross-sectional view illustrating the configuration of a semiconductor light emitting device according to a second embodiment. As illustrated in FIG. 9, the semiconductor light emitting device 120 according to the embodiment also includes the first semiconductor layer 10, the light emitting unit 30, the second semiconductor layer 20, the reflecting electrode 40, the oxide layer 41, and the nitrogen-containing layer 42. The semiconductor light emitting device 120 further includes the metal layer 50, the support substrate 60, and the bonding layer 61. The first semiconductor layer 10, the light emitting unit 30, the second semiconductor layer 20, the reflecting electrode 40, the metal layer 50, the support substrate 60, and the bonding layer 61 may be similar to those of the semiconductor light emitting device 110, and a description is omitted. Portions of the semiconductor light emitting device 120 that differ from those of the semiconductor light emitting device 110 will now be described.

In the semiconductor light emitting device 120, the oxide layer 41 is conductive; and the nitrogen-containing layer 42 also is conductive. Because the oxide layer 41 and the nitrogen-containing layer 42 are conductive, the first opening 41h and the second opening 42h may not be provided in the semiconductor light emitting device 120. Even in the case where the oxide layer 41 and the nitrogen-containing layer 42 are conductive, the first opening 41h and the second opening 42h may be provided.

For example, the oxide layer 41 may include an oxide of at least one selected from In, Zn, and Sn; and, for example, the oxide layer 41 may include ITO (Indium Tin Oxide). For example, the nitrogen-containing layer 42 includes an oxynitride of at least one selected from In, Zn, and Sn.

In such a case as well, a uniform and low contact resistance is obtained by performing heat treatment in an oxygen atmosphere in the state in which the oxide layer 41 is formed on the reflecting electrode 40 (the Ag layer). Then, the migration of the Ag is suppressed. By providing the nitrogen-containing layer 42 on the oxide layer 41, the migration due to the penetration of water, the occurrence of sulfides, and the diffusion of other elements to the interface between the Ag layer and the p-type GaN layer can be suppressed. In the semiconductor light emitting device 120 as well, a semiconductor light emitting device including an electrode formed using silver that has high performance and high reliability can be provided.

Figure 10:
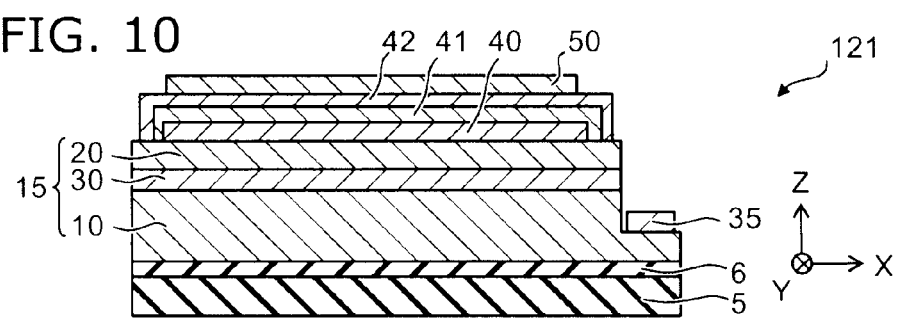
FIG. 10 is a schematic cross-sectional view illustrating the configuration of another semiconductor light emitting device according to the second embodiment.

FIG. 10 is a schematic cross-sectional view illustrating the configuration of another semiconductor light emitting device according to the second embodiment.

The semiconductor light emitting device 121 according to the embodiment as illustrated in FIG. 10 also includes the first semiconductor layer 10, the light emitting unit 30, the second semiconductor layer 20, the reflecting electrode 40, the oxide layer 41, and the nitrogen-containing layer 42. The semiconductor light emitting device 121 is a FC semiconductor light emitting device. In the semiconductor light emitting device 121, the oxide layer 41 and the nitrogen-containing layer 42 are conductive. Otherwise, the semiconductor light emitting device 121 is similar to the semiconductor light emitting device 111; and a description is therefore omitted. In the semiconductor light emitting device 121, the first opening 41h and the second opening 42h may or may not be provided. In the semiconductor light emitting device 121 as well, an electrode formed using silver that has high performance and high reliability can be realized.

Thus, the heat treatment is performed in an oxygen atmosphere to obtain a low contact resistance in the case where the Ag electrode is used. Although it is effective to perform the heat treatment after forming a metal film other than Ag on the Ag electrode to suppress the migration of the Ag, it was learned that the light emission intensity decreases at the central portion of the electrode, and the light emission is nonuniform. By such analysis, the inventor of the application discovered that although ohmic contact is obtained at the circumferential edge portion of the electrode, ohmic contact cannot be obtained at the central portion of the electrode. It was also seen that the element of a metal film other than Ag formed on the Ag electrode segregates to the interface between the Ag electrode and the p-type GaN layer. Thereby, problems were discovered in which the operating voltage Vf increases and the luminous efficiency decreases.

Conversely, in the embodiment, an insulative or conductive oxide layer 41 is formed on the Ag electrode instead of a metal film that diffuses easily; and the heat treatment is performed in oxygen via the oxide layer 41. Thereby, a uniform light emission distribution can be obtained. Also, the decrease of the reliability due to the penetration of impurities from the outside is suppressed by further providing the nitrogen-containing layer 42 on the oxide layer 41.

According to the embodiment, a semiconductor light emitting device including an electrode formed using silver that has high performance and high reliability and a method for manufacturing the same are provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor light emitting devices such as first semiconductor layers, second semiconductor layers, light emitting units, well layers, barrier layers, first intermediate layers, second intermediate layers, reflecting electrodes, oxide layers, nitrogen-containing layers, metal layers, support substrates, bonding layers, first semiconductor-layer side electrodes, crystal growth substrates, buffer layers, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices and deposition methods of methods for manufacturing semiconductor light emitting devices practicable by an appropriate design modification by one skilled in the art based on the semiconductor light emitting devices and the deposition methods of the methods for manufacturing semiconductor light emitting devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a first semiconductor layer of a first conductivity type;
   a light emitting unit provided on the first semiconductor layer;
   a second semiconductor layer of a second conductivity type provided on the light emitting unit;
   a reflecting electrode provided on the second semiconductor layer and including Ag;
   an oxide layer provided on the reflecting electrode, the oxide layer being insulative and having a first opening; and
   a nitrogen-containing layer provided on the oxide layer, the oxide layer being disposed between the reflecting electrode and the nitrogen-containing layer, the nitrogen-containing layer being insulative and having a second opening communicating with the first opening.

2. The device according to claim 1, wherein a surface area of a portion of the reflecting electrode exposed at the first opening and the second opening is less than a surface area of a portion of the reflecting electrode covered with the oxide layer.

3. The device according to claim 1, wherein the oxide layer includes an oxide of at least one selected from Si, Ge, Ti, Zr, Hf, Ce, Y, and La.

4. The device according to claim 3, wherein the nitrogen-containing layer includes a nitride or an oxynitride of at least one selected from Si, Ge, Ti, Zr, Hf, and Ce.

5. The device according to claim 1, wherein a thickness of the oxide layer is not less than 1 nanometer and not more than 100 nanometers.

6. The device according to claim 1, wherein a thickness of the nitrogen-containing layer is not less than 1 nanometer and not more than 10 nanometers.

7. The device according to claim 1, wherein
   the first semiconductor layer includes an n-type GaN layer, and
   the second semiconductor layer includes a p-type GaN layer.

8. The device according to claim 1, further comprising a metal layer,
   the nitrogen-containing layer being provided between the oxide layer and the metal layer,
   the metal layer covering a side face of the nitrogen-containing layer and a side face of the oxide layer, and
   the metal layer being electrically connected with the reflecting electrode via the first opening and the second opening.

9. The device according to claim 8, wherein
   the metal layer covers the side face of the nitrogen-containing layer in the second opening, and
   the metal layer covers the side face of the oxide layer in the first opening.

10. The device according to claim 1, wherein
    a part of the oxide layer covers an end portion of the reflecting electrode.

11. The device according to claim 10, wherein a part of the nitrogen-containing layer covers the part of the oxide layer.

12. The device according to claim 11, further comprising a metal layer electrically connected with the reflecting electrode via the first opening and the second opening,
the metal layer covering the part of the nitrogen-containing layer.

13. The device according to claim 1, further comprising a metal layer electrically connected with the reflecting electrode via the first opening and the second opening,
the metal layer covering the oxide layer and the nitrogen-containing layer.

14. A semiconductor light emitting device, comprising:
a first semiconductor layer of a first conductivity type;
a light emitting unit provided on the first semiconductor layer;
a second semiconductor layer of a second conductivity type provided on the light emitting unit;
a reflecting electrode provided on the second semiconductor layer, the reflecting electrode including Ag;
an oxide layer provided on the reflecting electrode, the oxide layer being conductive; and
an oxynitride layer provided on the oxide layer, the oxide layer being disposed between the reflecting electrode and the oxynitride layer and in direct contact with the reflecting electrode and the oxynitride layer, the oxynitride layer being conductive.

15. The device according to claim 14, wherein the oxide layer includes an oxide of at least one selected from In, Zn, and Sn.

16. The device according to claim 15, wherein the oxynitride layer includes at least one selected from In, Zn, and Sn.

17. The device according to claim 14, wherein a thickness of the oxide layer is not less than 1 nanometer and not more than 100 nanometers.

18. The device according to claim 14, wherein a thickness of the oxynitride layer is not less than 1 nanometer and not more than 10 nanometers.

19. The device according to claim 14, wherein
the first semiconductor layer includes an n-type GaN layer, and
the second semiconductor layer includes a p-type GaN layer.

20. The device according to claim 14, wherein a light emitted from the light emitting unit is reflected by the reflecting electrode and is emitted to outside from the first semiconductor layer.

21. The device according to claim 14, further comprising a metal layer,
the oxynitride layer being provided between the oxide layer and the metal layer,
the metal layer covering a side face of the oxynitride layer and a side face of the oxide layer, and
the metal layer being electrically connected with the reflecting electrode via the first opening and the second opening.

22. The device according to claim 21, wherein
the metal layer covers the side face of the oxynitride layer in the second opening, and
the metal layer covers the side face of the oxide layer in the first opening.

23. The device according to claim 14, wherein
a part of the oxide layer covers an end portion of the reflecting electrode.

24. The device according to claim 23, wherein a part of the oxynitride layer covers the part of the oxide layer.

25. The device according to claim 24, further comprising a metal layer electrically connected with the reflecting electrode via the first opening and the second opening,
the metal layer covering the part of the oxynitride layer.

26. The device according to claim 14, further comprising a metal layer electrically connected with the reflecting electrode via the first opening and the second opening,
the metal layer covering the oxide layer and the oxynitride layer.

27. A semiconductor light emitting device, comprising:
a first semiconductor layer of a first conductivity type;
a light emitting unit provided on the first semiconductor layer;
a second semiconductor layer of a second conductivity type provided on the light emitting unit;
a reflecting electrode provided on the second semiconductor layer, the reflecting electrode including Ag;
an oxide layer provided on the reflecting electrode on an opposite side of the reflecting electrode than the second semiconductor layer, the oxide layer being conductive; and
a nitrogen-containing layer provided on the oxide layer, the oxide layer being disposed between the reflecting electrode and the nitrogen-containing layer and in direct contact with the reflecting electrode and the nitrogen-containing layer, the nitrogen-containing layer being conductive.

* * * * *